(12) United States Patent
Tihanyi et al.

(10) Patent No.: US 6,534,830 B2
(45) Date of Patent: Mar. 18, 2003

(54) LOW IMPEDANCE VDMOS SEMICONDUCTOR COMPONENT

(75) Inventors: Jenoe Tihanyi, Kirchheim (DE); Wolfgang Werner, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/011,131

(22) Filed: Nov. 13, 2001

(65) Prior Publication Data

US 2002/0079535 A1 Jun. 27, 2002

Related U.S. Application Data

(63) Continuation of application No. PCT/DE00/01155, filed on Apr. 13, 2000.

(30) Foreign Application Priority Data

May 12, 1999 (DE) ............................... 199 22 187.1

(51) Int. Cl.$^7$ ............................................... H01L 29/76
(52) U.S. Cl. ............... 257/343; 257/328; 257/329; 257/330; 257/332; 257/341; 257/342; 257/343; 257/374; 436/270; 436/271
(58) Field of Search ................................ 257/330, 329, 257/332, 328, 374, 341, 343, 342; 438/270, 271

(56) References Cited

U.S. PATENT DOCUMENTS

| | | | | |
|---|---|---|---|---|
| 5,473,176 A | * | 12/1995 | Kakumoto | 257/192 |
| 5,561,078 A | * | 10/1996 | Tasaka | 437/67 |
| 5,623,152 A | * | 4/1997 | Majumdar et al. | 257/330 |
| 5,674,766 A | * | 10/1997 | Darwish et al. | 437/40 |
| 5,689,128 A | * | 11/1997 | Hshieh et al. | 257/331 |
| 5,751,024 A | * | 5/1998 | Takahashi | 257/139 |
| 5,864,159 A | * | 1/1999 | Takahashi | 257/330 |
| 5,981,996 A | | 11/1999 | Fujishima | |
| 6,114,726 A | * | 9/2000 | Barkhordarian | 257/341 |
| 6,211,549 B1 | * | 4/2001 | Funaki et al. | 257/329 |
| 6,228,719 B1 | * | 5/2001 | Frisina et al. | 438/268 |
| 6,262,453 B1 | * | 7/2001 | Hshieh | 257/341 |
| 6,262,470 B1 | * | 7/2001 | Lee et al. | 257/565 |

FOREIGN PATENT DOCUMENTS

| | | | | |
|---|---|---|---|---|
| DE | 195 34 154 A 1 | | 3/1997 | |
| JP | 05-075066 | * | 3/1993 | 257/330 |
| JP | 05-082792 | * | 4/1993 | 257/330 |
| JP | 8-222735 | | 8/1996 | |

* cited by examiner

*Primary Examiner*—George Eckert
*Assistant Examiner*—Edgardo Ortiz
(74) *Attorney, Agent, or Firm*—Laurence A. Greenberg; Werner H. Stemer; Ralph E. Locher

(57) ABSTRACT

A low impedance VDMOS semiconductor component having a planar gate structure is described. The VDMOS semiconductor component contains a semiconductor body of a first conductivity type having two main surfaces, including a first main surface and a second main surface disposed substantially opposite to one another. A highly doped first zone of the first conductivity type is disposed in an area of the first main surface. A second zone of a second conductivity type separates the first zone from the semiconductor body. The first zone and the second zone have a trench with a bottom formed therein reaching down to the semiconductor body. An insulating material fills the trench at least beyond an edge of the second zone facing the semiconductor body. A region of the second conductivity type surrounds an area of the bottom of the trench.

7 Claims, 3 Drawing Sheets

LOW IMPEDANCE VDMOS SEMICONDUCTOR COMPONENT

Cross-Reference to Related Application

This application is a continuation of copending International Application No. PCT/DE00/01155, filed Apr. 13, 2000, which designated the United States.

BACKGROUND OF THE INVENTION

Field of the Invention

The present invention is directed to a low impedance VDMOS semiconductor component having a planar gate structure. The component is formed of a semiconductor body of a first conductivity type having two main surfaces that are essentially opposite to one another. A highly doped first zone of the first conductivity type is provided in an area of one of the main surfaces, whereby the first zone is separated by a second zone of a second conductivity type from the semiconductor body. The first zone and the second zone are interspersed with a trench reaching up to the semiconductor body. Such a VDMOS semiconductor component of low impedance can be a VDMOS field effect transistor, in particular, and can be a bipolar transistor with an insulated gate (IGBT). Furthermore, the present invention relates to a method for producing such a VDMOS semiconductor component of low impedance.

FIG. 4 shows a traditional low impedance trench MOS field effect transistor for voltages between approximately 20 to 100 V (also compare U.S. Pat. No. 4,941,026). The traditional trench MOSFET has a semiconductor body 1 with an n+-doped drain zone 2, an n-doped semiconductor zone 3, a p-doped semiconductor zone 4 and with an n+-doped source zone 5. An annular trench 6, whose wall is covered with an insulating layer composed of silicon dioxide, for example, and which is filled with an n+-conducting polycrystalline silicon 8, extends through the source zone 5, the semiconductor zone 4 and the semiconductor zone 3 up to the drain zone 2.

A metallization 9 composed of aluminum, for example, is situated on the semiconductor body 1, which is composed of correspondingly doped silicon, for a grounded source electrode S. The drain zone 2 is connected to a drain electrode D at which a drain voltage $+U_D$ is adjacent. The polycrystalline silicon 8 is connected to a gate electrode G.

Such a traditional trench MOS field effect transistor is of low impedance and can be used for voltages between approximately 20 to 100 V without further ado. However, it is relatively complicated to produce due to the deep trench gates.

FIG. 5 shows another traditional MOS field effect transistor, which is referred to as a "HEXFET", for example. It is composed of the semiconductor body 1 with an n--conducting drain zone 10, an n--conducting semiconductor zone 11, an n-conducting semiconductor zone 12, an p-conducting annular semiconductor zone 13, and with n+-conducting semiconductor zones 14. The semiconductor body 1, with its respective zones 10 to 14, is formed of correspondingly doped silicon (see example of FIG. 4).

A drain contact 15, at which the drain voltage $+U_D$ is present, is attached to the semiconductor zone 10. On the side of the semiconductor body 1 that is opposite the drain contact 15, a gate electrode 17 composed of n+-doped polycrystalline silicon is embedded into a gate oxide layer 16 composed of silicon dioxide, for example. A metallization 18 composed of aluminum, for example, is also situated on the surface side for contacting the source zones 14.

A MOSFET having the structure as shown in FIG. 5 is simpler to produce than the MOSFET of FIG. 4. However, it is more surface-involved, since a trench is not provided there.

SUMMARY OF THE INVENTION

It is accordingly an object of the invention to provide a low impedance VDMOS semiconductor component which overcome the above-mentioned disadvantages of the prior art devices and methods of this general type, which can be produced in a simple way and requires a minimal surface area.

With the foregoing and other objects in view there is provided, in accordance with the invention, a low impedance VDMOS semiconductor component having a planar gate structure. The VDMOS semiconductor component contains a semiconductor body of a first conductivity type having two main surfaces, including a first main surface and a second main surface disposed substantially opposite to one another. A highly doped first zone of the first conductivity type is disposed in an area of the first main surface. A second zone of a second conductivity type separates the first zone from the semiconductor body. The first zone and the second zone have a trench with a bottom formed therein reaching down to the semiconductor body. An insulating material fills the trench at least beyond an edge of the second zone facing the semiconductor body. A region of the second conductivity type surrounds an area of the bottom of the trench.

It is advantageous that the region of the second conductivity type reaches up to the second zone and that the trench filled with the conducting material is filled with the conducting material at least up to the edge of the second zone facing the one main surface.

It is also expedient that at least one further region of the second conductivity type is provided in the semiconductor body below the region of the second conductivity type.

It is possible to completely fill the trench with the insulating material when the semiconductor component is an IGBT.

Glass such as "flow glass" can be used for the insulating material. Furthermore, it is advantageous that an upper epitaxy layer is doped higher in the semiconductor body than epitaxy layers lying there below.

With the foregoing and other objects in view there is provided, in accordance with the invention, a method for producing a low impedance VDMOS semiconductor component. The method includes the steps of: providing a semiconductor body of a first conductivity type having two main surfaces, including a first main surface and a second main surface disposed substantially opposite to one another; providing a highly doped first zone having the first conductivity type disposed in an area of the first main surface in a second zone of a second conductivity type separating the first zone from the semiconductor body; forming a trench having a bottom extending through the first zone, the second zone and reaching down to the semiconductor body; filling the trench with an insulating material at least beyond an edge of the second zone facing the semiconductor body; and forming a region of the second conductivity type to surround an area of the bottom of the trench. The region is produced by out-diffusion of a dopant of the second conductivity type from the area of the bottom of the trench.

A method for producing a semiconductor component of the aforementioned species is characterized in that the region of the second conductivity type is formed by out-diffusion of a dopant of the second conductivity type from the area of the bottom of the trench. If the first conductivity type is n-conducting, boron is preferably provided as a dopant for the second conductivity type. In this case, the boron is out-diffused from the area of the bottom of the trench.

The dopant, namely boron in the present example, can be previously introduced by ion implantation into the area of the bottom of the trench.

The inventive method, therefore, represents a slight modification of a VDMOS process with a self-adjusting contact hole for the trench; after the trench has been deeply etched, the dopant of the second conductivity type, such as boron, is implanted and out-diffused from the bottom of the trench. Subsequently, the trench is partially filled up with the insulating material, particularly "flow glass", whereby the pn-transition between the first zone and the second zone remains free in the trench. The region created by the out-diffusion of the dopant of the second conductivity type reaches the second zone of the second conductivity type, so that, overall, a continuous p-conducting region arises in the area around the bottom of the trench up to the first zone of the first conductivity type when boron is used for the out-diffusion. Further "buried" regions of the second conductivity type, which are situated below the region of the second conductivity type, can be potentially provided. Such further regions of the second conductivity type can be created by epitaxial eliminations of individual semiconductor layers and implantations.

Finally, a metallization is performed after the individual steps for creating the region of the other mode of conductivity have been carried out.

Advantageously, an upper epitaxy layer is doped higher in the semiconductor body than layers lying there below. Therefore, an upper epitaxy layer, in which the first zone of the first conductivity type and the second zone of the second conductivity type are situated, is n--conducting when the region of the second conductivity type is p-conducting as a result of the out-diffusion of boron. The epitaxy layers provided there below then are n-conducting.

Overall, a low impedance VDMOS semiconductor component thus arises wherein the conductivity of the current path is approximately double in the n-conducting semiconductor body, so that the turn-on resistance can be reduced by half. A further region of the second conductivity type below the region of the second conductivity type is already sufficient for applications below approximately 100 V. Correspondingly more regions of the second conductivity type can be provided for higher voltages.

The inventive VDMOS semiconductor component preferably is a VDMOS field effect transistor. The invention, however, can also be advantageously applied to IGBT's.

Other features which are considered as characteristic for the invention are set forth in the appended claims.

Although the invention is illustrated and described herein as embodied in a low impedance VDMOS semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
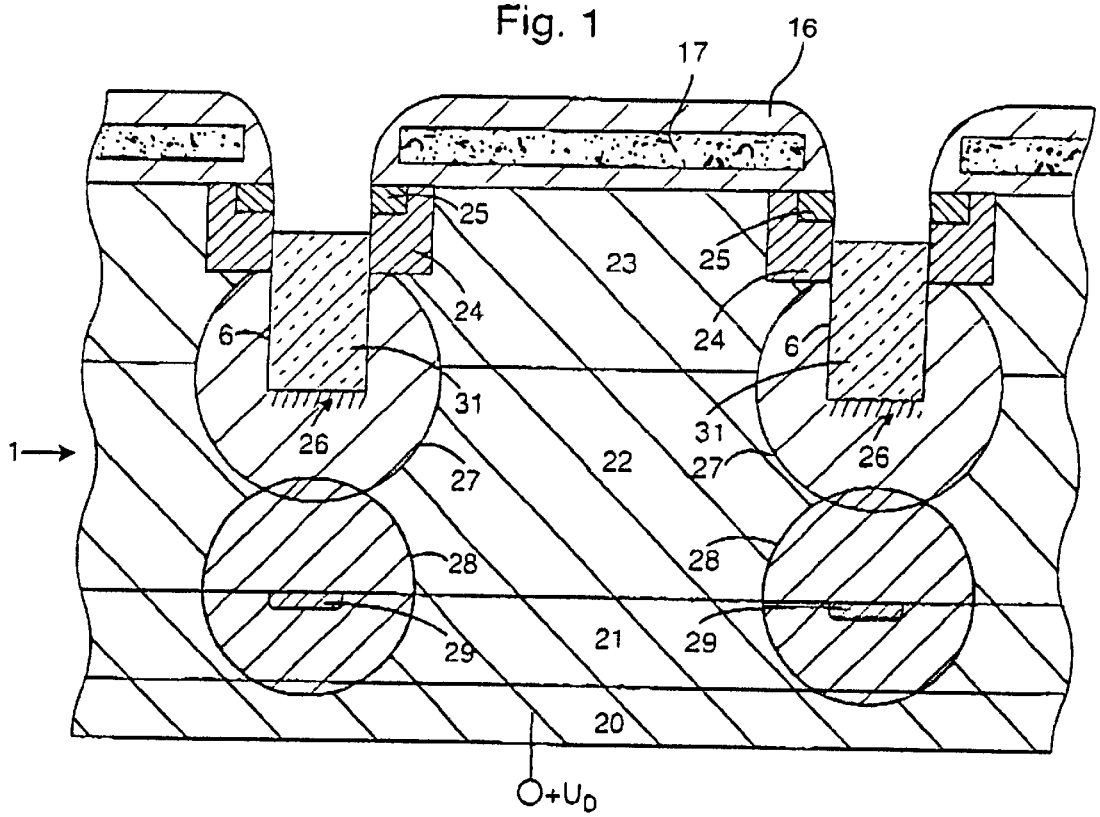
FIGS. 1 and 2 are diagrammatic, sectional views for explaining the production of a VDMOS field effect transistor according to the invention.

In all the figures of the drawing, sub-features and integral parts that correspond to one another bear the same reference symbol in each case. Referring now to the figures of the drawing in detail and first, particularly, to FIG. 1 thereof, there is shown the semiconductor body 1 having an n++-conducting drain zone or, respectively, a substrate 20, an n-conducting first epitaxy layer 21, an n-conducting second epitaxy layer 22 and an n--conducting epitaxy layer 23. An annular p-conducting semiconductor zone 24, in which an n+-conducting source zone 25 is situated, is embedded into the epitaxy layer 23. The semiconductor body 1 and therefore the zones or, respectively, layers 20 to 25 are composed of correspondingly doped silicon.

A trench 6 extending approximately up to the epitaxy layer 22 is formed through the zones 24 and 25. On the basis of ion implantation, a dopant of the second conductivity type, such as boron, is implanted and out-diffused into a bottom 26 of the trench 6 when the first conductivity type is n-conducting, so that a p-conducting region arises. A p-conducting region 27 reaches up to the zone 24.

After the completion of the gate electrodes 17 in the gate insulating layer 16 composed of silicon dioxide, a metallization 18 (compare FIG. 2), which is composed of aluminum for example, is provided for contacting the zones 25, 24.

Further regions 28 of an opposite conductivity, namely p-conducting regions in the present example, can be potentially present below the region 27. The regions are created by implantation of boron into areas 29 of the epitaxy layer 21 and by out-diffusion of the boron after the next epitaxy layer 22 has been applied.

Figure 2:
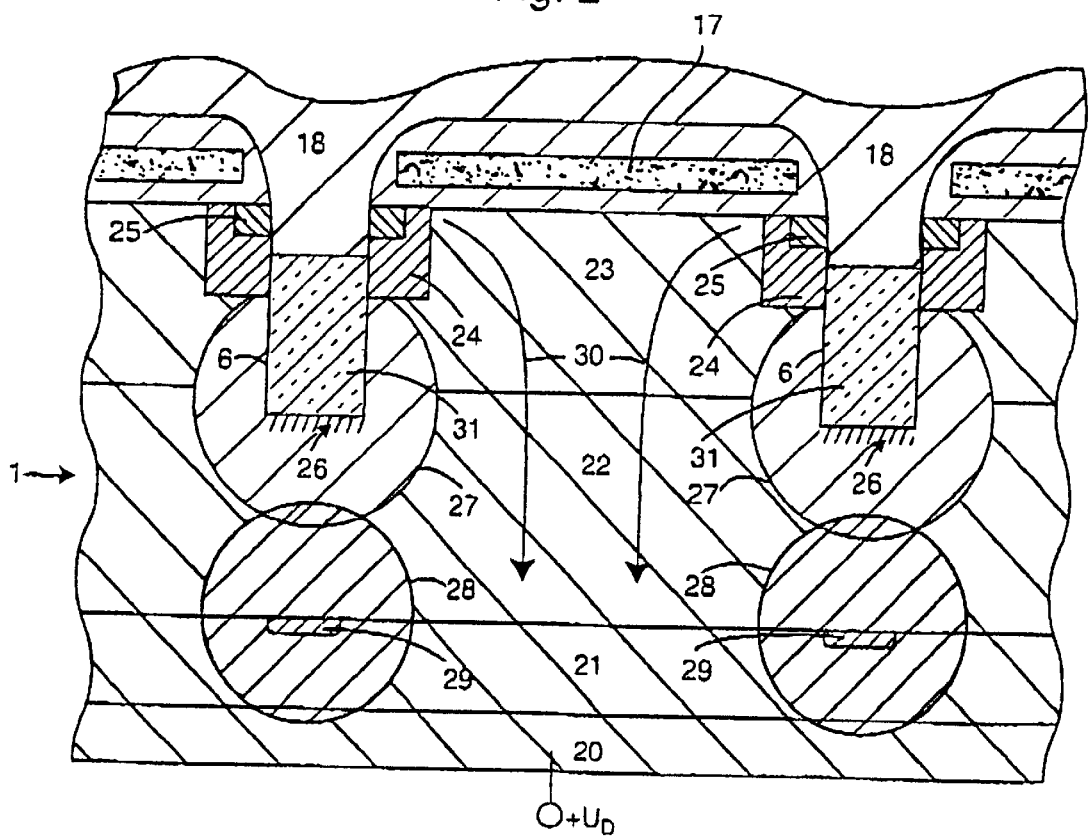

Overall, a VDMOS field effect transistor having the structure as shown in FIG. 2 is thus formed, the structure containing arrows 30 for indicating the course of the current path between the source and the drain.

Figure 3:
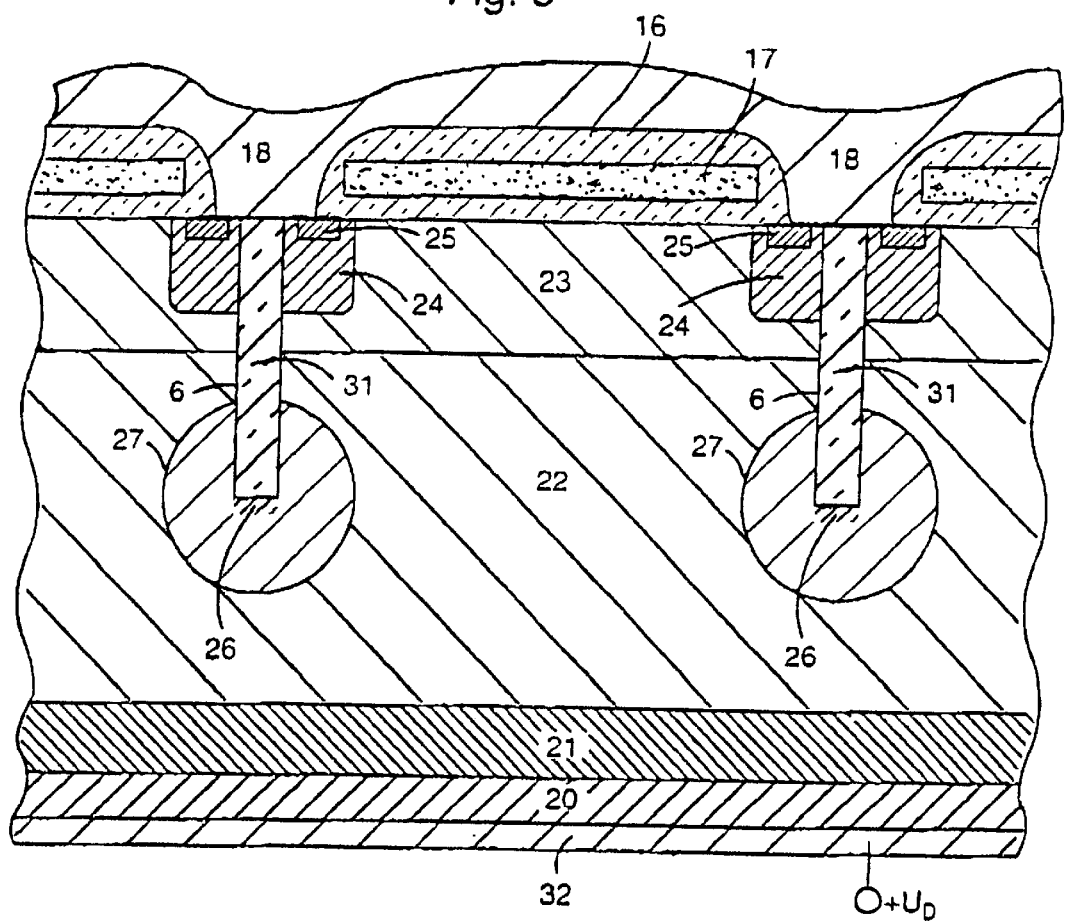
FIG. 3 is a sectional view through an IGBT according to the invention.
Figure 4:
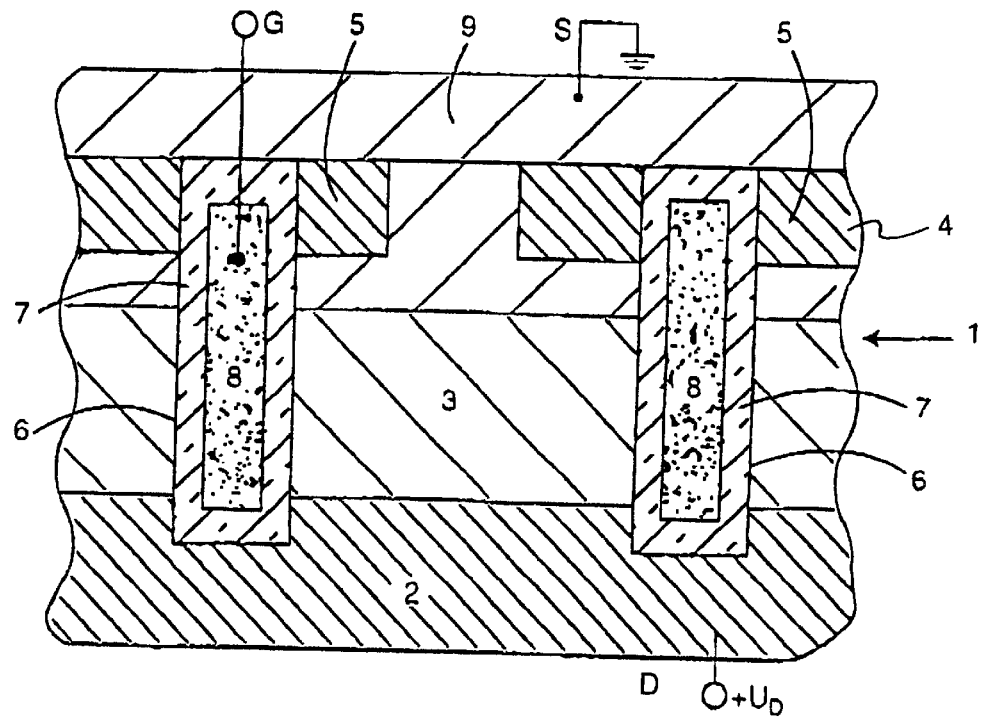
FIG. 4 is a sectional view through a known trench field effect transistor.
Figure 5:
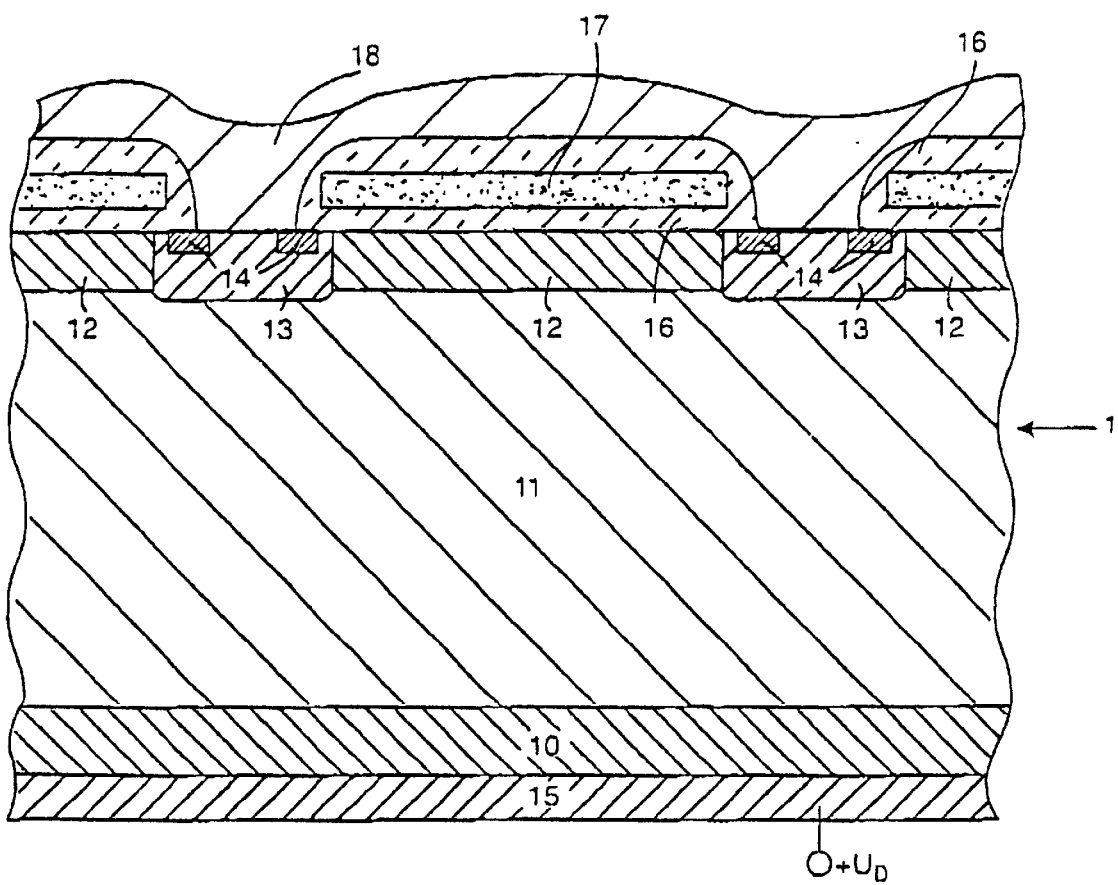
FIG. 5 is a sectional view through another known field effect transistor.

As a further exemplary embodiment of the invention, FIG. 3 shows an IGBT, whereby the trench 6 is completely filled with an insulating material 31 composed of silicon dioxide, for example. Given the VDMOS field effect transistor of FIGS. 1 and 2, the insulating material 31 only reaches up to such a height in the trench 6 that the pn-transition between the first zone 25 and the second zone 24 remains free of the insulating material.

FIG. 3 also shows a drain contact 32 contacting the p--conducting epitaxy layer 20 on which the n+-conducting epitaxy layer 21 and the n--conducting epitaxy layer 22 can be provided.

We claim:

1. A low impedance VDMOS semiconductor component having a planar gate structure, comprising:

a semiconductor body of a first conductivity type having two main surfaces, including a first main surface and a second main surface disposed substantially opposite to one another;

a highly doped first zone of the first conductivity type disposed in an area of said first main surface;

a second zone of a second conductivity type separating said first zone from said semiconductor body, said first zone and said second zone having a trench with a bottom formed therein reaching down to said semiconductor body;

an insulating material filling said trench at least beyond an edge of said second zone facing said semiconductor body; and a region of the second conductivity type surrounding an area of said bottom of said trench.

2. The low impedance VDMOS semiconductor component according to claim 1, wherein said region of the second conductivity type reaches up to said second zone and said trench is filled with said insulating material at least up to said edge of said second zone facing said first main surface.

3. The low impedance VDMOS semiconductor component according to claim 1, including at least one further region of the second conductivity type disposed in said semiconductor body below said region of the second conductivity type.

4. The low impedance VDMOS semiconductor component according to claim 1, wherein said trench is completely filled with said insulating material.

5. The low impedance VDMOS semiconductor component according to claim 1, wherein said insulating material is glass.

6. The low impedance VDMOS semiconductor component according to claim 1, wherein said semiconductor body has an epitaxy layer disposed adjacent to said first main surface and further epitaxy layers lying below said epitaxy layer, said epitaxy layer being doped higher than said further epitaxy layers.

7. The low impedance VDMOS semiconductor component according to claim 1, wherein said region of the second conductivity type is doped with boron.

* * * * *